United States Patent [19]
Risch et al.

[11] Patent Number: 5,844,834
[45] Date of Patent: Dec. 1, 1998

[54] SINGLE-ELECTRON MEMORY CELL CONFIGURATION

[75] Inventors: Lothar Risch, Neubiberg; Wolfgang Rösner, München, both of Germany

[73] Assignee: Siemens Aktiengesellschaft, Munich, Germany

[21] Appl. No.: 867,114

[22] Filed: Jun. 2, 1997

[30]  Foreign Application Priority Data

May 31, 1996 [DE] Germany .................. 196 21 994.0

[51] Int. Cl.[6] ................................................ G11C 7/00
[52] U.S. Cl. .......................................... 365/150; 365/149
[58] Field of Search .................................. 365/150, 149, 365/189.01

[56]  References Cited

U.S. PATENT DOCUMENTS 5,357,460  10/1994  Yusuki et al. ...................... 365/150 X

OTHER PUBLICATIONS

"Single–Electron Memory" (Nakazato et al.), American Institute of Physics, 75 (10), May 15, 1994, pp. 5123–5134.
"Single Electron Memory Cells", Electronics World, Apr. 1996, ISSCC Report, p. 298.

"Room–Temperature Single–Electron Memory" (Yano et al.), IEEE Transactions on Electron Devices, vol. 41, No. 9, Sep. 1994, pp. 1628–1637.

"Simulation of Single Electron Circuits" (Rösner et al.), Microelectronic Engineering 27, 1995, pp. 55–58.

*Primary Examiner*—Do Hyun Yoo
*Attorney, Agent, or Firm*—Herbert L. Lerner; Laurence A. Greenberg

[57]  ABSTRACT

Each memory cell of an array has a single-electron transistor and a single-electron memory element. The single-electron transistor is driven by a charge stored in the memory element. When a read voltage is applied, a current flows through the single-electron transistor which is dependent on the stored charge, but the stored charge in not changed. When a write voltage is applied, the magnitude of which is greater than the read voltage, then the stored charge is changed. The memory cells of the array are each connected between first lines and transverse second lines of a memory cell configuration.

9 Claims, 3 Drawing Sheets

SINGLE-ELECTRON MEMORY CELL CONFIGURATION

BACKGROUND OF THE INVENTION

1. Field of the Invention

Dynamic random-access memory (DRAM) cell configurations are currently produced primarily using CMOS technology. They comprise memory cells which each have a read-out transistor and a capacitor. The information to be stored is stored on the capacitor in the form of a quantity of charge. The signal charge is usually about 50 fC, i.e., it consists of 300,000 electrons. The capacitance of the capacitor is 20 to 30 fF in contemporary memory cells.

With the increasing packing density of future memory configurations, the area per memory cell decreases. This being the case, it is becoming ever more difficult, and will finally be impossible, to produce a capacitor with the relatively high storage capacitance of 20 to 30 fF on the area available for the memory cell. Neither can the size of the read-out transistor be reduced without limitation.

With a view to further miniaturization, so-called single-electron components have been proposed, in which switching processes are effected with single electrons. An investigation of single-electron components of this type is disclosed, for example, by W. Rösner et al., Microelectronic Engineering, Vol. 27, 1995, pages 55–58. Single-electron components comprise tunnel elements which are connected via tunnel contacts to adjacent terminals. Charge carriers cross these tunnel contacts both via the quantum-mechanical tunneling effect and by simple thermal overcoming of a potential barrier. These charge carrier transits take place sufficiently infrequently. The tunnel elements are, for example, produced as small conductive islands which are surrounded by an insulating structure.

If a voltage U is applied across the two terminals, for which voltage the Coulomb barrier condition is fulfilled, that it to say one whose magnitude satisfies $$|U| < \frac{e}{2C},$$

then the charge of the tunnel element cannot change because of the potential conditions, so long as the thermal energy satisfies $$\frac{kT}{e} \ll \frac{e}{2C}.$$

Here, k is the Boltzmann constant, T is the temperature, e is the charge of one electron and C is the capacitance of the tunnel element.

When a higher voltage is applied, electrons can flow to the tunnel element through one of the tunnel contacts. These single-electron components are operated in such a way that a single electron is transferred at a time.

By driving the tunnel element via a gate electrode which capacitively affects the tunnel element, without tunneling events occurring in the operating voltage range, it is possible for current to flow through the tunnel element. So long as a suitable electric charge is effective on the gate electrode, the single-electron component has an approximately linear current-voltage characteristic passing through the origin. A gate-controlled single-electron component of this type is referred to as a single-electron transistor in the pertinent art literature.

K. Nakazato et al., J. Appl. Phys., Vol. 75, No. 10, 1994, pages 5123–5134 proposed a single-electron memory cell. It comprises three so-called multitunnel elements. The term "multitunnel element" denotes a series circuit of tunnel elements which are each connected to one another via a tunnel contact. The multitunnel elements each have a lateral gate electrode, via which a current through the multitunnel elements can be controlled. A first multitunnel element and a second multitunnel element are in this case connected in series between a first voltage source and ground. The two multitunnel elements are connected to one another via a memory node. The lateral gate electrodes of the multitunnel elements are connected to a second voltage source or to a third voltage source.

The memory node is connected via a capacitor to as fourth voltage source. The memory node is connected via a further capacitor to a third multitunnel element which is connected between a fifth voltage source and ground. The third multitunnel element is likewise driven by a lateral gate electrode which is connected to a sixth voltage source.

The third multitunnel element acts as an electrometer with which information can be found regarding the charge on the memory node. Measurements during which a high negative voltage was added at the lateral gate electrode of the second multitunnel element showed that individual electrons can be stored stably in the first multitunnel element and in the memory node, so long as the voltage applied to the multitunnel element fulfills the Coulomb barrier condition. Depending on the voltage applied to the lateral gate electrode, a discrete number of electrons can be stored stably in the memory element formed by the memory node and the first multitunnel element. This is explained by the fact that the electrostatic energy of the memory element for the respectively corresponding number of stored electrons assumes a metastable state. Between neighboring metastable states, the electrostatic energy has a potential barrier, the top of which is higher than the next metastable state. The height of the potential barriers depends on the number of electrons stored and the number of tunnel contacts in the multitunnel element.

The single-electron memory cell is made of δ-doped GaAs (delta-doped GaAs). The fact that six voltage sources are necessary to operate the single-electron memory cell, renders driving a large number of such memory cells an elaborate operation.

SUMMARY OF THE INVENTION

It is accordingly an object of the invention to provide a single-electron memory cell configuration, which overcomes the above-mentioned disadvantages of the heretofore-known devices and methods of this general type and which is less demanding to drive than the previously proposed systems.

With the foregoing and other objects in view there is provided, in accordance with the invention, a single-electron memory cell configuration, comprising:

a plurality of mutually parallel first lines and a plurality of mutually parallel second lines, the second lines extending transversely to the first lines;

a plurality of memory cells each connected between one of siad first lines and one of the second lines;

each of the memory cells having a single-electron memory element and a single-electron transistor;

a first gate electrode connected to a respective one of the second lines and a memory node capacitively driven via the first gate electrode;

the single-electron memory element including at least one tunnel element and a first tunnel contact connecting the at least one tunnel element to a respective one of the first lines and a second tunnel contact connecting the at least one tunnel element to the memory node driven via the first gate electrode;

a second gate electrode connected to the memory node;

the single-electron transistor having a first terminal connected to one of the first lines and a second terminal connected to one of the second lines, and the single-electron transistor being driven capacitively via the second gate electrode;

the memory element and the single-electron transistor having respective capacitances adjusted such that, on application of a read voltage between the first line and the second line having a magnitude less than a write voltage, a current flows through the single-electron transistor, the current being dependent on a charge stored in the memory element, without changing the charge stored in the memory element, and such that, on application of the write voltage between the first line and the second line, the charge stored in the memory element is changed.

The first lines and the second lines are comparable with the word and bit lines in state of the art DRAM configurations.

Since, in the single-electron memory cell configuration according to the invention, each memory cell is connected between one of the first lines and one of the second lines, each of the memory cells can be driven in simple fashion by applying corresponding voltage levels to the associated first line and the associated second line.

The single-electron memory element comprises at least one tunnel element which is connected via a first tunnel contact to the first line, and via a second tunnel contact to a memory node which can be driven capacitively via a first gate electrode. Charges are transferred via the tunnel contacts both by quantum-mechanical tunneling effects and by sufficiently infrequent thermal overcoming of a potential barrier. If the tunneling resistance $R_T > R_K = h/e^2 \approx 26$ k$\Omega$ (where $R_K$ is the Klitzing resistance, h is the effective Planck quantum, and e is the charge of an electron), then the majority of charge transfers take place by elementary processes. The tunneling resistance is preferably greater than 100 k$\Omega$, so that the elementary processes predominate in the charge transfer. The first gate electrode is connected to the second line. The single-electron transistor is connected via a first terminal to the first line, and via a second terminal to the second line. It can be driven capacitively via a second gate electrode which is connected to the memory node.

The capacitances of the memory element and of the single-electron transistors are tailored in such a way that, on application of a read voltage by the single-electron transistor, a current dependent on a charge stored in the memory element flows. The charge stored in the memory element is in this case not changed. The charge stored in the memory element can, however, be changed by applying a write voltage whose magnitude is greater than that of the read voltage.

The invention exploits the discovery that a single-electron transistor is a sensitive electrometer for a charge acting on the gate electrode of the single-electron transistor. The read voltage is selected in such a way that the Coulomb barrier condition is fulfilled. The current flowing via the single-electron transistor is dependent on the charge on the memory node, since the memory node is connected to the second gate electrode of the single-electron transistor. At the same time, a change in the charge stored on the memory node is prevented by the fact that the read voltage applied to the first gate electrode is not sufficient to change the electric charge on the memory node. In this case, use is made of the fact that the number of electrons which can be stored stably in a multitunnel element is dependent both on the number of tunnel contacts in the multitunnel element and on the gate voltage with which the multitunnel element is driven.

The capacitances of the single-electron memory element and of the single-electron transistor are adapted to one another in such a way that, at the same time, the Coulomb barrier condition is fulfilled for the single-electron transistor and a change in the charging state of the single-electron memory element is not possible, when the read voltage is applied. However, a change in the charging state of the memory node is effected with the write voltage, whose magnitude is greater than the read voltage.

For driving a memory cell in order to read the information, a voltage level corresponding to the read voltage is applied between the associated first line and second line. The remaining first lines and second lines are connected to the same potential as the selected first line, so that all cells not belonging to the selected second line do not have a voltage applied to them. In order to write information items into a memory cell, a voltage level corresponding to the write voltage is applied between the associated first line and second line. The remaining first lines and second lines are connected in such a way that the level of the voltage drop across the remaining memory cells is lower, and is one at which no change in the stored charge takes place. The remaining lines may, for example, have a voltage level applied to them which corresponds to the read voltage or the difference between the write and read voltages.

The capacitances of the memory element and of the single-electron transistor are preferably tailored in such a way that the magnitude of the read voltage is half as much as the magnitude of the write voltage. When information is written into a memory cell, in this case it is possible for the remaining first lines and the second lines to have the read voltage applied to them and the voltage drop across some of the unselected memory cells is always the same. The remainder of the unselected memory cells do not have a voltage applied to them.

The memory element preferably comprises a plurality of tunnel elements which are respectively connected to one another as a series via tunnel contacts. The statements made regarding the first tunnel contact and the second tunnel contact also apply to these tunnel contacts. The first tunnel element is in this case connected via the first tunnel contact to the first line, and the last tunnel element in the series is connected via the second tunnel contact to the memory node. The effect of providing a plurality of tunnel contacts in the memory element is that the number of stable charging states in the memory element increases for a fixed voltage at the first gate electrode.

All structures which comprise an electrically conductive region and which are insulated from neighboring electrically conductive regions by an insulation structure may be formed as tunnel elements. The electrically conductive regions are connected by tunnel contacts through the insulation structure. Structures which are particularly suitable as tunnel elements are those which comprise a conductive core and an insulating shell which surrounds the conductive core. The diameter of the tunnel element is in this case between approximately 1 and 10 nm. The capacitance of the tunnel elements is, in this size range, small enough for the memory cell configuration to function at room-temperature. In particular, metal clusters with organic ligands as an insulating shell, as disclosed in German patent disclosure DE 42 12 220 A1, or fullerenes with an encapsulated metal core are suitable as tunnel elements.

Furthermore, lithographically structured thin metal layers are suitable as tunnel elements, the tunnel contacts resulting from oxidation of such a metal layer and subsequent deposition and structuring of a further metal layer.

Within the framework of molecular electronics, further suitable tunnel elements are sections of individual molecules which can carry different charges depending on their past history. Charges are transferred between variable-charge molecule sections of this type along chemical bonds.

With the assumption that the tunneling resistance of the tunnel contacts is $R_T \gg R_K = h/e^2 \approx 26$ k$\Omega$ ($R_K$—Klitzing resistance, h—Planck constant, e—charge of an electron), that the electrical response of the memory cell is determined sufficiently accurately by the tunnel contacts, the capacitances and the voltage levels of the first line and of the second line, and line resistances and AC impedances are negligible, that only one tunneling event takes place via one tunnel contact at a given time, so that the remaining tunnel contacts can be regarded as capacitors during the tunneling event, that all the tunnel contacts have the same capacitance, and that the capacitive contributions of the remaining memory cells of the memory cell configuration are negligible, the following condition is satisfied for stable charging states in the memory element:

$$\frac{C_G}{e} \cdot V - \frac{1}{2}(m-\gamma) < I < \frac{C_G}{e} \cdot V + \frac{1}{2}(m-\gamma)$$

with $m = 1 + n\gamma$ $$\gamma = \frac{C_G}{C}$$

wherein $C_G$ is the capacitance of the first gate electrode

C is the capacitance of a tunnel contact in the memory element n is the number of tunnel contacts in the memory element V is the voltage at the first gate electrode I is the number of electrons stored in the memory element e is the charge of an electron.

For a memory cell which assumes the stable states +e and −e on application of a write voltage ±$V_{write}$, the condition for stable charging states gives $$\frac{C_G}{e} \cdot V_{write} - \frac{1}{2}(m-\gamma) < 1 < \frac{C_G}{e} \cdot V_{write} + \frac{1}{2}(m-\gamma)$$

The condition that the zero-electron charging state is unstable on application of the write voltage $V_{write}$ leads to $$0 < \frac{C_G}{e} \cdot V_{write} - \frac{1}{2}(m-\gamma)$$

The charging state +e, in particular, should be stable on application of the read voltage $V_{read}$, i.e.

$$\frac{C_G}{e} \cdot V_{read} - \frac{1}{2}(m-\gamma) < -1$$

and, furthermore, the Coulomb barrier condition should be fulfilled for the single-electron transistor:

$$V_{read} < \frac{e}{C_{\Sigma t}}$$

where $C_{\Sigma t}$ is the total capacitance of the transistor.

The total capacitance of the single-electron transistor is given by the sum of the capacitances of the tunnel contacts which form the single-electron transistor and the capacitance of the second gate electrode.

These conditions are fulfilled for the following voltages and capacitances:

$$V_{read} = \frac{1}{2} \cdot V_{write}$$

$$C_G = \frac{4e}{V_{write}}$$

$$C = \frac{n-1}{6} C_G$$

$$C_{\Sigma t} \leq C_G$$

The invention is not restricted to these capacitance values. By selecting a different read voltage $V_{read}$, by exploiting the full range of the inequalities, by stipulating other and/or more stable charging states for the read or write voltages, or by other assumptions in the derivation of the stability criterion, for example that the tunnel contacts have differing capacitances, other criteria for the capacitances can be determined in a similar fashion.

Other features which are considered as characteristic for the invention are set forth in the appended claims.

Although the invention is illustrated and described herein as embodied in a single-electron memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
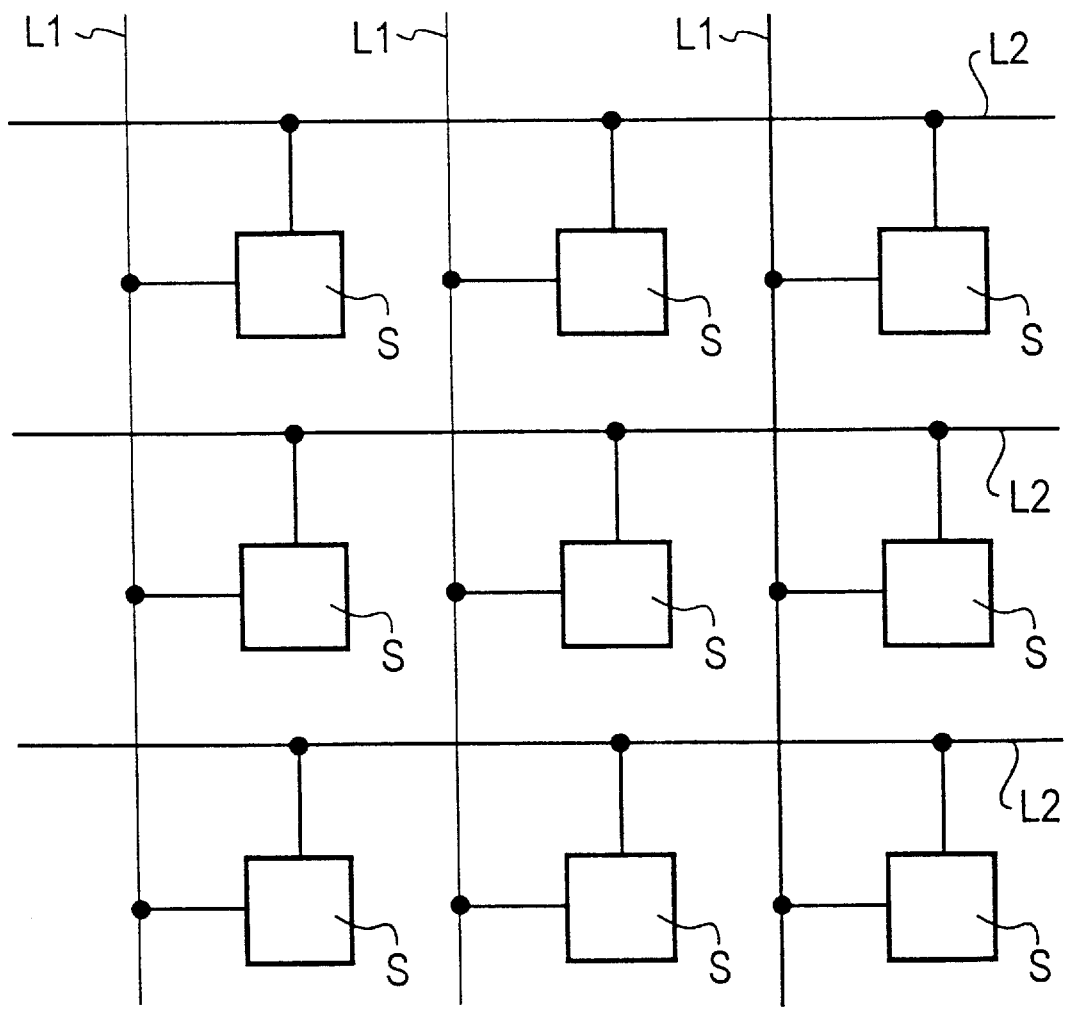
FIG. 1 is a schematic circuit diagram of a memory cell configuration according to the invention.

Referring now to the figures of the drawing in detail and first, particularly, to FIG. 1 thereof, there is seen a memory cell configuration with first lines L1, which are substantially parallel to one another, and second lines L2, which are likewise substantially parallel to one another. The first lines L1 of the illustrated embodiment extend transversely to the second lines L2.

The memory cell configuration comprises memory cells S which are each connected between one of the first lines L1 and one of the second lines L2. By driving one of the first lines L1 and one of the second lines L2, each of the memory cells S can be discretely and unambiguously driven.

Figure 2:
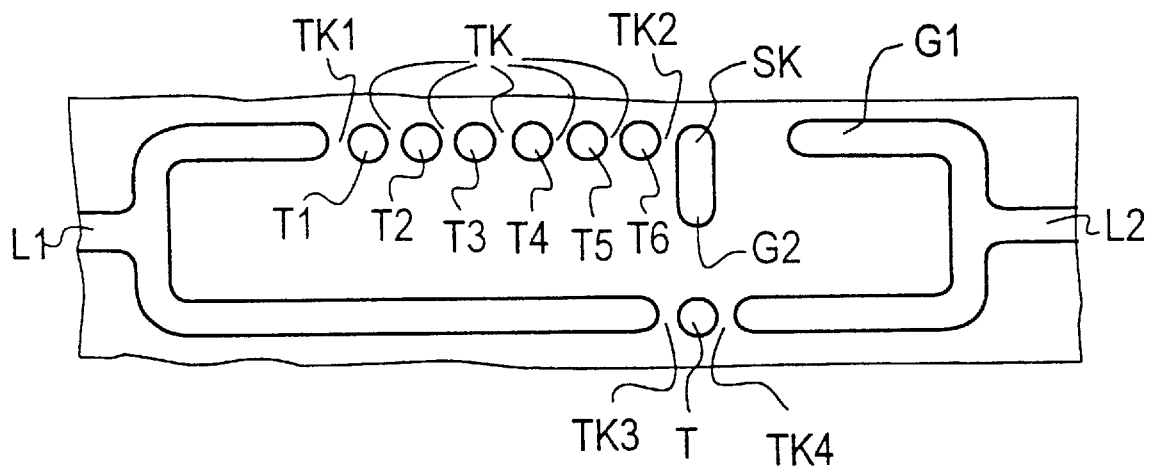
FIG. 2 is a plan view of a memory cell.
Figure 3:
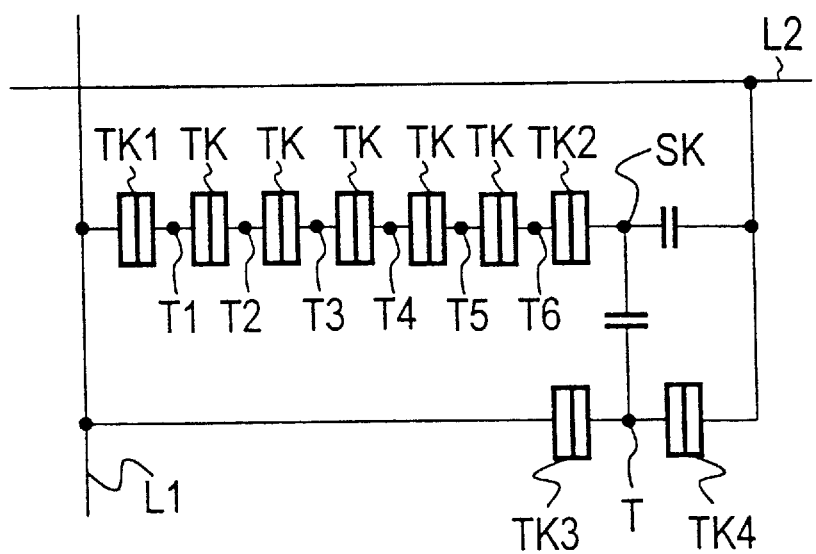
FIG. 3 is a representative circuit diagram of the memory cell illustrated in FIG. 2.

With reference to FIGS. 2 and 3, each of the memory cells comprises six tunnel elements T1, T2, T3, T4, T5, T6 which are interconnected via tunnel contacts TK. The first of the tunnel elements T1 is connected via a first tunnel contact TK1 to a terminal of one of the first lines L1. The last of the tunnel elements T6 in the series is connected via a second tunnel contact TK2 to a memory node SK. The memory node SK can be driven capacitively via a first gate electrode G1. The distance between the first gate electrode G1 and the memory node SK is large enough so that no tunneling events take place between the first gate electrode G1 and the memory node SK at the intended operating voltages in the memory cell configuration. The first gate electrode G1 is connected to one of the second lines L2.

The first gate electrode G1, the memory node SK and the tunnel elements T1, T2, T3, T4, T5, T6, with the tunnel contacts TK1, TK, TK2 located in between, form one memory element.

Furthermore, each of the memory cells comprises a transistor tunnel element T which is connected via a first transistor tunnel contact TK3 to one terminal of the first line L1, and is connected via a second transistor tunnel contact TK4 to a terminal of the second line L2. The transistor tunnel element T is driven via a second gate electrode G2 which is connected to the memory node SK. The distance between the second gate electrode G2 and the transistor tunnel element T is large enough such that the transistor is driven capacitively and that no tunneling event takes place between the second gate electrode G2 and the transistor tunnel element T at the operating voltages of the memory cell configuration. The transistor tunnel element T, the first transistor tunnel contact TK3, the second transistor tunnel contact TK4 and the second gate electrode G2 form one single-electron transistor. The tunnel elements T1, T2, T3, T4, T5, T6 are, for example, produced as conductive islands, for example with a round cross-section, on an insulating surface. The tunnel elements T1, T6 are, for example, made of gold, aluminum or titanium with a diameter of, for example, 3 nm. The insulating surface on which the memory cell is disposed is, for example, the surface of an $SiO_2$ layer (film) on a silicon substrate. The memory cell configuration may furthermore be arranged on a sapphire substrate.

The distance between mutually adjacent tunnel elements T1, T2, T3, T4, T5, T6, and thereby the dimensions of the tunnel contacts TK1, TK, TK2, is, for example, 2 nm. The memory node SK and the second gate electrode G2, as well as the first gate electrode G1 and the lines L1 and L2, are, for example, produced as metallic regions on the insulating surface. They are likewise made of gold, aluminum or titanium. The distance between the first gate electrode G1 and the memory node SK is, for example, 5 nm.

The dimensions of the memory node SK are, for example, 3 nm.

The transistor tunnel element T is likewise formed as a conductive island, for example, of gold, aluminum or titanium. The preferred dimension in the exemplary embodiment is a round cross-section with a diameter of 3 nm. The terminals connecting with the first line L1 and with the second line L2 are likewise produced as metallic interconnections of, for example, gold, aluminum and titanium. The distance from the transistor tunnel element to the terminals connecting with the first line L1 or with the second line L2, and therefore the dimensions of the transistor tunnel contacts TK3, TK4 are 2 nm. The distance between the second gate electrode G2 and the transistor tunnel element T is 5 nm.

The area required per memory cell is about 500 $nm^2$. A 1 Tbit memory cell configuration can thereby be produced on an area of 5 $cm^2$.

The memory cell is, for example, produced by depositing individual metal atoms on an insulating surface with the aid of a scanning tunneling electron microscope or an atomic force microscope.

As an alternative, a surface-wide metal layer having a thickness of, for example, 3 nm, can be structured by lithography, in particular by using electron radiation or synchrotron radiation, or by oxidation with a scanning probe microscope.

The non-conducting gaps between the tunnel elements can be produced both by oxidation of an originally metallic layer, and by using lithographic methods and reactive ion etching. By way of example, the tunneling resistance of the tunnel contacts TK1, TK, TK2 is in each case 100 kΩ and the associated capacitance is in each case 1 aF. The capacitance of the first gate electrode $C_G$ is 1 aF. The capacitance of the transistor tunnel contacts TK3, TK4 is in each case 0.1 aF. The capacitance of the second gate electrode G2 is 0.3 aF. The total capacitance of the single-electron memory transistor is therefore $C_{\Sigma t}=2 \cdot C_t+C_{tg}=0.5$ aF.

The memory cell is operated with a read voltage $V_{read}$ of 0.32 volt and a write voltage of 0.64 volt.

Figure 4:
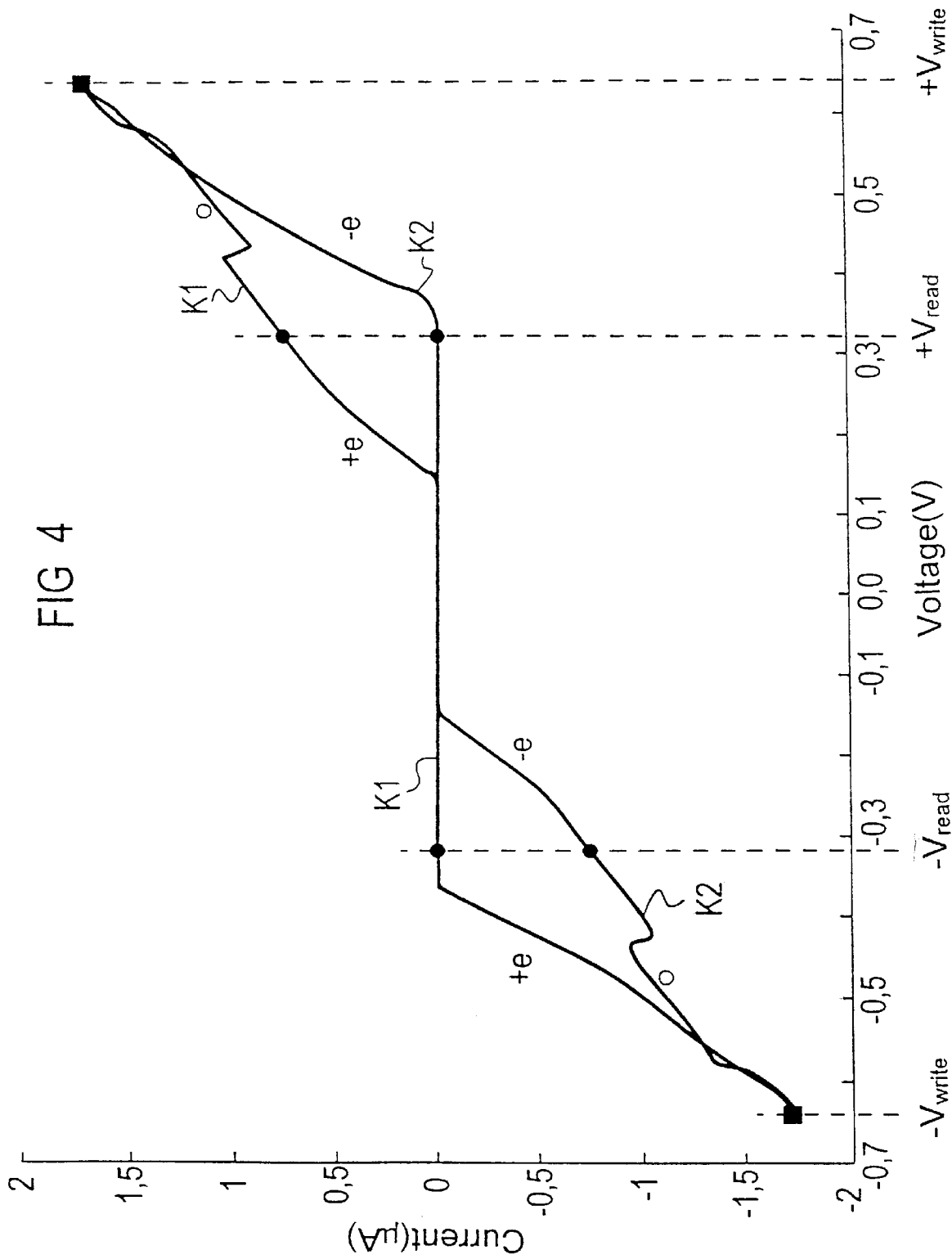
FIG. 4 is a graph with characteristic curves of the memory cell according to the invention.

The operation of the memory cell will now be explained with reference to the characteristic curves of the memory-cell represented in FIG. 4. There is shown a first characteristic curve K1 and a second characteristic curve K2. The first characteristic curve K1 relates to the case when the charging state +e is stored in the memory element. The second characteristic curve K2 relates to the case when the charging state -e is stored in the memory element. If a voltage $+V_{read}$ is applied between the first line L1 and the second line L2, and if the charging state +e is stored in the memory element, then a current of about 0.8 $\mu A$ flows through the transistor. If, however, the charging state -e is stored, then no current flows through the transistor when a voltage of $+V_{read}$ is applied.

On application of a voltage of $-V_{read}$, no current flows through the transistor if the charging state +e is stored, and a current of about -0.8 $\mu A$ flows if the charging state -e is stored.

If the charging state +e is stored, the current increases when the write voltage $+V_{write}$, is applied, the unstable zero-charge state is passed through, and, when the level $+V_{write}$, is reached, the charging state -e is written into the memory element. In order to write in the charging state +e, a voltage level $-V_{write}$, is applied, at which, if the charging state -e was stored, the unstable zero state is passed through and the charging state +e is written into the memory element. The read voltage $V_{read}$ is selected in such a way that, while a clear discrimination between the charging states -e and +e is possible by means of the current flow, a charge variation of the stable charging states +e and -e remains prevented.

We claim:

1. A single-electron memory cell configuration, comprising:
   a plurality of mutually parallel first lines and a plurality of mutually parallel second lines, said second lines extending transversely to said first lines;
   a plurality of memory cells each connected between one of siad first lines and one of said second lines;
   each of said memory cells having a single-electron memory element and a single-electron transistor;
   a first gate electrode connected to a respective one of said second lines and a memory node capacitively driven via said first gate electrode;

said single-electron memory element including at least one tunnel element and a first tunnel contact connecting said at least one tunnel element to a respective one of said first lines and a second tunnel contact connecting said at least one tunnel element to said memory node driven via said first gate electrode;

a second gate electrode connected to said memory node;

said single-electron transistor having a first terminal connected to one of said first lines and a second terminal connected to one of said second lines, and said single-electron transistor being driven capacitively via said second gate electrode;

said memory element and said single-electron transistor having respective capacitances adjusted such that, on application of a read voltage between said first line and said second line having a magnitude less than a write voltage, a current flows through said single-electron transistor, the current being dependent on a charge stored in said memory element, without changing the charge stored in the memory element, and such that, on application of the write voltage between said first line and said second line, the charge stored in the memory element is changed.

2. The configuration according to claim 1, wherein the respective capacitances of said memory element and of said single-electron transistor are adjusted such that a magnitude of the read voltage is half a magnitude of the write voltage.

3. The configuration according to claim 1, wherein said at least one tunnel element is a first tunnel element of a plurality of tunnel elements, and the memory element further comprises a plurality of tunnel contacts connecting said plurality of tunnel elements in series, wherein said first tunnel element is connected via said first tunnel contact to said first line, and a last tunnel element in said series being connected to said memory node via said second tunnel contact.

4. The configuration according to claim 3, wherein said tunnel elements of said plurality of tunnel elements each have a substantially equal capacitance.

5. The configuration according to claim 4, wherein the following conditions are satisfied for the capacitances in said memory element and in said single-electron transistor:

$$V_{read} = \frac{1}{2} \cdot V_{write}$$

$$C_G = \frac{4e}{V_{write}}$$

$$C = \frac{n-1}{6} C_G$$

$$C_{\Sigma t} \leq \frac{1}{2} C_G$$

where:

C capacitance of a tunnel contact in the memory element;

$C_G$ capacitance of the first gate electrode;

$C_{\Sigma t}$ total capacitance of the single-electron transistor;

n number of tunnel contacts in the memory element;

$V_{read}$ read voltage; and $V_{write}$ write voltage.

6. The configuration according to claim 1, wherein said at least one tunnel element comprises a conductive core and an insulating shell surrounding said conductive core, said conductive core and said insulating shell together having a diameter of between 0.1 nm and 10 nm.

7. The configuration according to claim 3, wherein each of said tunnel elements comprises a conductive core and an insulating shell surrounding said conductive core, said conductive core and said insulating shell together having a diameter of between 0.1 nm and 10 nm.

8. The configuration according to claim 1, wherein said at least one tunnel element is formed by a partial surface region of an originally surface-wide metallic layer and a non-conductive gap surrounding said partial surface region.

9. The configuration according to claim 3, wherein said tunnel elements are formed by partial surface regions of an originally surface-wide metallic layer and by non-conductive gaps among said partial surface regions.

* * * * *

UNITED STATES PATENT AND TRADEMARK OFFICE
CERTIFICATE OF CORRECTION

PATENT NO : 5,844,834
DATED : December 1, 1998
INVENTOR(S): Lothar Risch et al.

It is certified that error appears in the above-identified patent and that said Letters Patent is hereby corrected as shown below:

On the title page,

Item [30] should read as follows:

May 31, 1996   [DE]   Germany ............ 196 21 994.9

Signed and Sealed this

Twenty-fifth Day of May, 1999

Attest:

Q. TODD DICKINSON

*Attesting Officer*   *Acting Commissioner of Patents and Trademarks*